United States Patent
Wang

(10) Patent No.: US 11,258,048 B2
(45) Date of Patent: Feb. 22, 2022

(54) DISPLAY PANEL WITH FIRST ELECTRODE HAVING DIFFERENT REFRACTIVE INDEXES IN SUB-PIXEL REGIONS OF DIFFERENT COLORS AND DISPLAY PANEL DEVICE HAVING THE SAME

(71) Applicant: WUHAN CHINA STAR OPTOELECTRONICS SEMICONDUCTOR DISPLAY TECHNOLOGY CO., LTD., Hubei (CN)

(72) Inventor: Bo Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 121 days.

(21) Appl. No.: 16/650,396

(22) PCT Filed: Nov. 14, 2019

(86) PCT No.: PCT/CN2019/118331
§ 371 (c)(1),
(2) Date: Mar. 25, 2020

(87) PCT Pub. No.: WO2021/017312
PCT Pub. Date: Feb. 4, 2021

(65) Prior Publication Data
US 2021/0057677 A1 Feb. 25, 2021

(30) Foreign Application Priority Data

Aug. 1, 2019 (CN) .......................... 201910706852.5

(51) Int. Cl.
*H01L 51/52* (2006.01)
*H01L 27/12* (2006.01)
*H01L 27/32* (2006.01)

(52) U.S. Cl.
CPC ...... *H01L 51/5275* (2013.01); *H01L 27/1218* (2013.01); *H01L 27/322* (2013.01);
(Continued)

(58) Field of Classification Search
USPC .......................................................... 257/79
See application file for complete search history.

(56) References Cited

U.S. PATENT DOCUMENTS

| 9,666,836 B2 | 5/2017 | Kamimura et al. |
| 2005/0140277 A1 | 6/2005 | Suzuki |

(Continued)

FOREIGN PATENT DOCUMENTS

| CN | 1638580 A | 7/2005 |
| CN | 107204400 A | 9/2017 |
| CN | 108365115 A | 8/2018 |

*Primary Examiner* — Nduka E Ojeh
(74) *Attorney, Agent, or Firm* — Mark M. Friedman

(57) ABSTRACT

The present invention provides a display panel and a display device thereof. The display panel includes a substrate, a reflective layer, pixel retaining walls, first electrodes, a light emitting layer, and a second electrode. In the present invention, by adjusting refractive indexes of first electrodes in each sub-pixel region with different colors, microcavity effects are used to enhance color saturation of emitted light and component efficiency. In this way, difficulties resulting from using vacuum evaporation methods along with fine masks to prepare hole transport layers with different thickness and problems such as low utilization of evaporation material are prevented.

16 Claims, 2 Drawing Sheets

(52) U.S. Cl.
CPC .... *H01L 51/5271* (2013.01); *H01L 2251/306* (2013.01); *H01L 2251/308* (2013.01)

(56) References Cited

U.S. PATENT DOCUMENTS

| | | | | |
|---|---|---|---|---|
| 2008/0111477 | A1* | 5/2008 | Kim | H01L 27/3272 |
| | | | | 313/504 |
| 2010/0133994 | A1* | 6/2010 | Song | H01L 27/3211 |
| | | | | 313/504 |
| 2015/0137081 | A1* | 5/2015 | Kim | H01L 51/5265 |
| | | | | 257/40 |
| 2015/0325803 | A1* | 11/2015 | Lee | H01L 51/0096 |
| | | | | 257/40 |
| 2018/0090546 | A1* | 3/2018 | Hashimoto | H01L 51/0005 |
| 2020/0373364 | A1* | 11/2020 | Yoon | H01L 27/3246 |

\* cited by examiner

DISPLAY PANEL WITH FIRST ELECTRODE HAVING DIFFERENT REFRACTIVE INDEXES IN SUB-PIXEL REGIONS OF DIFFERENT COLORS AND DISPLAY PANEL DEVICE HAVING THE SAME

FIELD OF INVENTION

The present invention relates to the field of display technologies, and in particular, to a display panel and a display device thereof.

BACKGROUND OF INVENTION

Organic light emitting display (OLED) devices are also called organic electric laser display devices, or organic light emitting semiconductors. A basic structure of an OLED is a sandwich-like structure consisting of a thin and transparent indium tin oxide (ITO) film layer with semiconductor properties, a positive electrode layer connected to the ITO film layer, and another second metal electrode layer. An entire structure layer comprises a hole transport layer (HTL), a light emitting layer (EL), and an electron transport layer (ETL). When an appropriate amount of voltage is applied, positive electrode holes and charges of the second electrode will be combined in the light emitting layer, and under an action of Coulomb force, they will be recombined to form excitons in an excited state (electron-hole pair). However, the excited state is unstable in an ordinary environment. The excitons in the excited state recombine and transfer energy to luminescent materials, causing them to transition from a ground state energy level to the excited state. An excited state energy generates photons through a radiation relaxation process, releases light energy, generates light, and produces three primary colors of red, green, and blue according to its formula and forms basic colors.

First, a characteristic of OLEDs is that they emit light themselves, unlike thin film transistor liquid crystal display (TFT-LCD) devices which need backlights, so their visibility and brightness are high. Secondly, because OLEDs have the advantages of low voltage demand, high power saving efficiency, fast response times, lightweight, a thin thickness, a simple structure, low cost, wide viewing angles, almost infinitely high contrast, low power consumption, and extremely high response speed, they have become one of the most important display technologies today. OLEDs have gradually replaced TFT-LCDs and are expected to become a mainstream of next-generation display technologies after LCDs.

Technical Problem

With the development of technologies over time, high-resolution, full-color OLED display devices are a trend of the OLED development. At present, OLEDs can use effects of resonant cavities to enhance color saturation of emitted light and component efficiency. Generally, by adjusting thicknesses of hole transport layers and by using vacuum masking methods along with fine masks, the hole transport layers with different thicknesses are formed. However, it is difficult to perform the methods and utilization efficiency of evaporation materials is not high. Therefore, a new type of display panel is needed to solve the above problems.

Technical Solution

An object of the present invention is to provide a display panel and a display device thereof, which can solve problems such as difficulties in manufacturing methods and low utilization of evaporation materials in the prior art.

In order to solve the above problem, an embodiment of the present invention provides a display panel comprising a substrate, a reflective layer, pixel retaining walls, first electrodes, a light emitting layer, and a second electrode. The reflective layer is disposed on the substrate. The pixel retaining walls are disposed on the reflective layer at intervals. The first electrodes are disposed on the reflective layer between adjacent pixel retaining walls. The light emitting layer is disposed on the first electrodes. The second electrode is disposed on the light emitting layer. The first electrodes comprise a first electrode unit and a second electrode unit, and a refractive index of the first electrode unit is less than a refractive index of the second electrode unit.

Further, the first electrodes further comprise a third electrode unit, and the refractive index of the second electrode unit is less than a refractive index of the third electrode unit.

Further, the first electrode unit, the second electrode unit, and the third electrode unit are respectively disposed corresponding to a blue pixel, a green pixel, and a red pixel, the refractive index of the first electrode unit is less than the refractive index of the second electrode unit, and the refractive index of the second electrode unit is less than the refractive index of the third electrode unit.

Further, a composition material of the reflective layer comprises one or more of Ag, Al, Au, and Pt.

Further, a thickness of the reflective layer ranges from 100 nm to 500 nm.

Further, a thickness of the pixel retaining wall ranges from 300 nm to 1000 nm.

Further, a liquid repellent layer is provided on a surface of the pixel retaining wall away from the substrate.

Further, a composition material of the first electrode comprises one or more of ITO, IZO, ATO, and a composite ink of poly (3,4-ethylenedioxythiophene) and poly-p-styrene sulfonic acid.

Further, a thickness of the first electrode ranges from 10 nm to 50 nm.

Another embodiment of the present invention further provides a display device comprising a display panel according to the present invention.

Beneficial Effect

The present invention relates to a display panel and a display device thereof. In the present invention, by adjusting refractive indexes of first electrodes in each sub-pixel region with different colors, microcavity effects are used to enhance color saturation of emitted light and component efficiency. In this way, difficulties resulting from using vacuum evaporation methods along with fine masks to prepare hole transport layers with different thickness and problems such as low utilization of evaporation material are prevented.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

Figure 1:
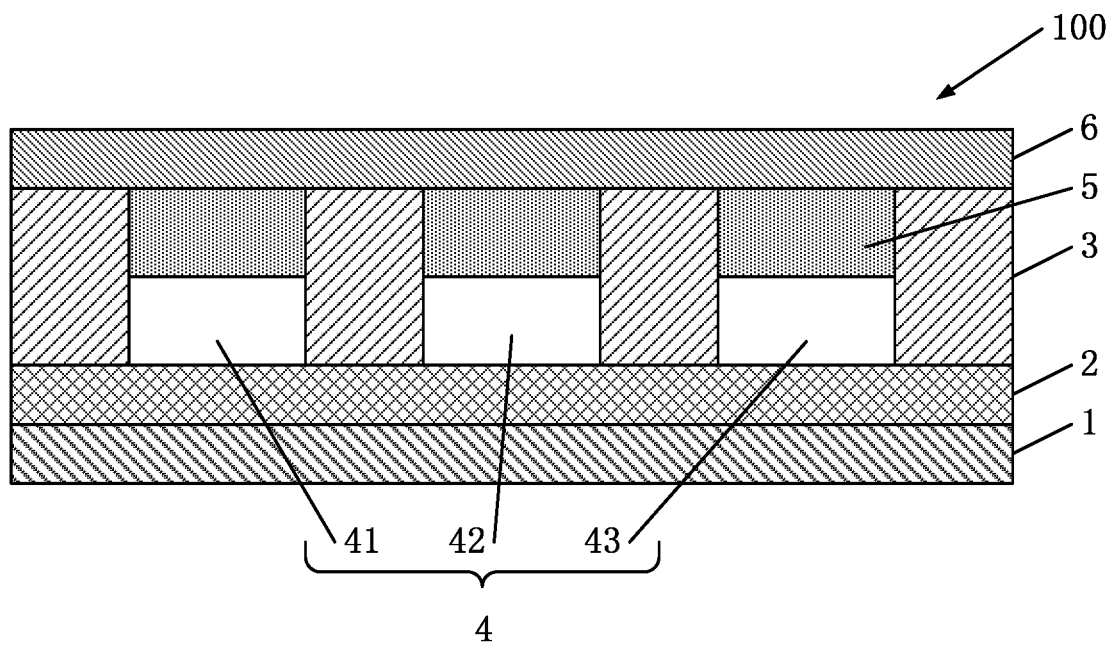
FIG. 1 is a schematic structural view of a display panel of the present invention.

Parts in the drawing are identified as follows:

| | |
|---|---|
| 1. substrate | 2. reflective layer |
| 3. pixel retaining wall | 4. first electrode |
| 5. light emitting layer | 6. second electrode |
| 41. first electrode unit | 42. second electrode unit |
| 43. third electrode unit | |

DETAILED DESCRIPTION OF PREFERRED EMBODIMENTS

The following describes preferred embodiments of the present invention in detail with reference to accompanying drawings in order to completely introduce technical contents of the present invention to those skilled in the art, to exemplify that the present invention can be implemented, to make the disclosed technical content of the present invention clearer, and It will be easier for those skilled in the art to understand how to implement the invention. However, the present invention can be embodied by many different forms of embodiments. The protection scope of the present invention is not limited to the embodiments mentioned in the text, and the description of the following embodiments is not intended to limit the scope of the present invention.

The directional terms mentioned in the present invention, such as "up", "down", "front", "rear", "left", "right", "inside", "outside", "side", etc., are only directions in the drawings. The directional terms are used for describing and understanding rather than limiting the present invention.

In the figures, units having similar structures are used for the same reference numbers. In addition, in order to facilitate understanding and description, a size and thickness of each component shown in the drawings are arbitrarily shown, and the present invention does not limit the size and thickness of each component.

When certain components are described as being "on" another component, the component may be disposed directly on another component. There may also be an intermediate component, the component is disposed on the intermediate component, and the intermediate component is disposed on the another component. When a component is described as "installed to" or "connected to" another component, the two can be understood as directly "installed" or "connected" or a component is "installed to" or "connected to" another component through an intermediate component.

Example 1

As shown in FIG. 1, a display panel 100 comprises a substrate 1, a reflective layer 2, pixel retaining walls 3, first electrodes 4, a light emitting layer 5, and a second electrode 6.

As shown in FIG. 1, the reflective layer 2 is disposed on the substrate 1. Specifically, a composition material of the reflective layer 2 comprises one or more of Ag, Al, Au, and Pt. Thus, light leaked from the light emitting layer 5 through the first electrodes 4 can be totally reflected, thereby improving light emitting efficiency of the display panel 100.

A thickness of the reflective layer 2 ranges from 100 nm to 500 nm. Preferably, 250 nm or 300 nm can be selected. Thus, a relatively thin display panel 100 can be formed, thereby achieving an effect of improving customer experience.

As shown in FIG. 1, the pixel retaining walls 3 are disposed on the reflective layer 2 at intervals. Specifically, a thickness of the pixel retaining wall 3 ranges from 300 nm to 1000 nm. When the thickness of the pixel retaining wall 3 is less than 300 nm, an effect of limiting the composition material of the first electrode 4 to a specific region cannot be achieved, and an effect of avoiding light crosstalk cannot be achieved in the end. When the thickness of the pixel retaining wall 3 is greater than 1000 nm, it will increase production costs and increase a thickness of the display panel 100. In the embodiment, it may preferably be 650 nm.

As shown in FIG. 1, the first electrodes 4 are disposed on the reflective layer 2 between adjacent pixel retaining walls 3. Opening regions between the adjacent pixel retaining walls 3 are sub-pixel regions with different colors, which are a blue pixel, a green pixel, and a red pixel, respectively.

As shown in FIG. 1, the first electrodes 4 comprise a first electrode unit 41, a second electrode unit 42, and a third electrode unit 43. A refractive index of the first electrode unit 41 is less than a refractive index of the second electrode unit 42, and the refractive index of the second electrode unit 42 is less than a refractive index of the third electrode unit 43. More specifically, the first electrode unit 41, the second electrode unit 42, and the third electrode unit 43 are respectively disposed corresponding to a blue pixel, a green pixel, and a red pixel. The refractive index of the first electrode unit 41 is less than the refractive index of the second electrode unit 42, and the refractive index of the second electrode unit 42 is less than the refractive index of the third electrode unit 43. Therefore, a microcavity effect can be formed by adjusting the refractive indexes of the first electrodes 4 in the different sub-pixel regions, and finally an effect of enhancing color saturation of emitted light and component efficiency is achieved.

The microcavity effect is that when a light emitting region of a device is disposed in a resonant cavity composed of a total reflective film and a semi-reflective film, when a length of the cavity and a wavelength of a light are of the same order of magnitude, light with a specific wavelength will be selected and strengthened, and a spectrum will be narrowed. According to characteristics of the microcavity effect, a wavelength of the light is proportional to the refractive index of the first electrode 4. A wavelength of blue light is less than a wavelength of green light, and the wavelength of green light is less than a wavelength of red light. Therefore, it is necessary to ensure that the refractive index of the first electrode unit 41 corresponding to the blue pixel is less than the refractive index of the second electrode unit 42 corresponding to the green pixel. Simultaneously, the refractive index of the second electrode unit 42 corresponding to the green pixel is less than the refractive index of the third electrode unit 43 corresponding to the red pixel.

A composition material of the first electrode comprises one or more of ITO, IZO, ATO, and a composite ink of poly (3,4-ethylenedioxythiophene) and poly-p-styrene sulfonic acid. Since the refractive index relationship of the above materials is: ITO>IZO>ATO>the composite ink of poly (3,4-ethylenedioxythiophene) and poly-p-styrene sulfonic acid, in order to satisfy that the refractive index of the first electrode unit 41 is less than the refractive index of the second electrode unit 42, and the refractive index of the second electrode unit 42 is less than the refractive index of the third electrode unit 43, in the embodiment, the composition material of the first electrode unit 41 is the composite ink of poly (3,4-ethylenedioxythiophene) and poly-p-styrene sulfonic acid, the composition material of the second electrode unit 42 is ATO, and the composition material of the third electrode unit 43 is ITO. Therefore, by adjusting the refractive indexes of the first electrodes 4 in each sub-pixel region with different colors, the microcavity effect is used to enhance the color saturation of the emitted light and the component efficiency.

A liquid repellent layer is provided on a surface of the pixel retaining wall 3 away from the substrate 1. In other words, the surface of the pixel retaining wall 3 and the composition materials of the first electrode 4 have mutually exclusive physical properties. The specific implementation method varies according to the composition material of the first electrode 4. For example, when the first electrode 4 uses the composite ink of poly (3,4-ethylenedioxythiophene) and poly-p-styrene sulfonic acid as the composition material, the surface of the SiNx composition material of the pixel retaining wall 3 needs to be processed with plasma treatment to form a liquid repellent layer, thereby increasing the hydroxyl content on the surface of SiNx and finally achieving the liquid repellency of the composite ink. This can prevent ink droplets in each sub-pixel region from climbing to adjacent pixel regions when the first electrodes 4 are subsequently formed by inkjet printing processes, which greatly reduces climbing heights of the ink droplets so that formed film thicknesses of the first electrodes 4 are relatively uniform.

Specifically, a thickness of the first electrode 4 ranges from 10 nm to 50 nm. In the embodiment, it is preferably 30 nm. This can well reflect the light.

As shown in FIG. 1, the light emitting layer 5 is disposed on the first electrodes 4, and the second electrode 6 is disposed on the light emitting layer 5. As a result, when an appropriate amount of voltage is applied, holes of the first electrodes 4 and charges of the second electrode 6 are combined in the light emitting layer 5. Under an action of the Coulomb force, excitons (electron-hole pair) in an excited state recombine with a certain probability. The excited state is unstable in an ordinary environment. The excitons in the excited state recombine and transfer energy to luminescent materials, causing them to transition from a ground state energy level to the excited state. An excited state energy generates photons through a radiation relaxation process, and thus releases light energy and produces light.

Figure 2:
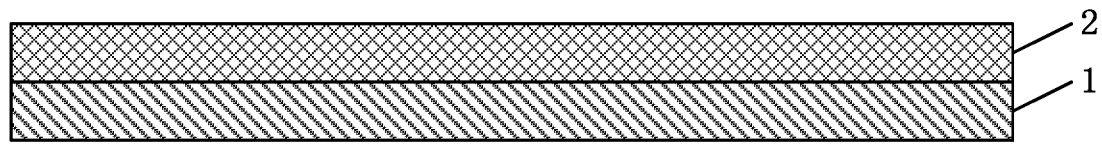
FIG. 2 is a first schematic view of a structure of the display panel of the present invention.

The present invention further provides a manufacturing method of a display panel 100, and the specific steps are as follows:

As shown in FIG. 2, a substrate 1 is provided, and a reflective layer 2 is deposited on the substrate 1.

Figure 3:
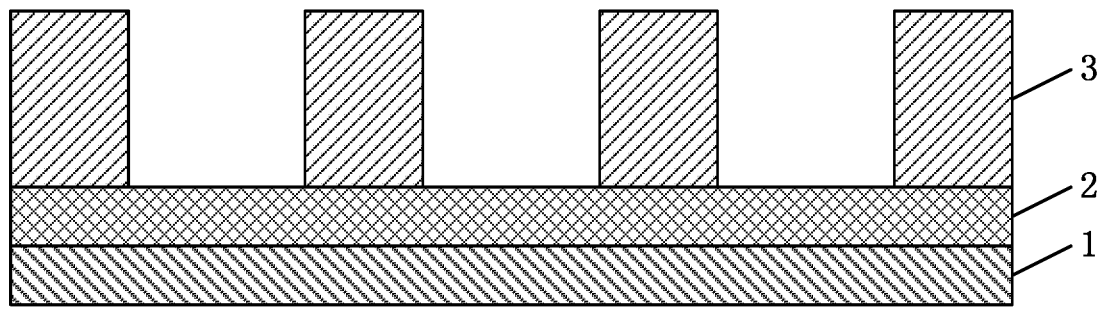
FIG. 3 is a second schematic view of the structure of the display panel of the present invention.

As shown in FIG. 3, a SiNx layer is coated on the reflective layer 2 and formed into pixel retaining walls 3 disposed at intervals by a dry etching process. Opening regions between the pixel retaining walls 3 are sub-pixel regions with different colors, which are a blue pixel, a green pixel, and a red pixel, respectively.

Figure 4:
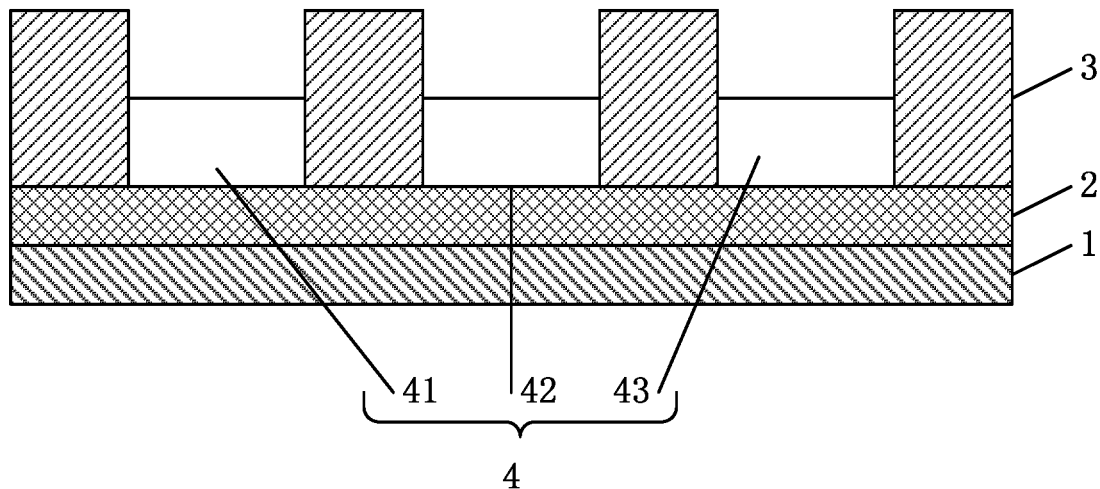
FIG. 4 is a third schematic view of the structure of the display panel of the present invention.

As shown in FIG. 4, first electrodes 4 having different refractive indexes are formed on the reflective layer 2 between the adjacent pixel retaining walls 3 by using an inkjet printing process. Specifically, the first electrodes 4 comprise a first electrode unit 41, a second electrode unit 42, and a third electrode unit 43 respectively corresponding to a blue pixel, a green pixel, and a red pixel. A refractive index of the first electrode unit 41 is less than a refractive index of the second electrode unit 42, and the refractive index of the second electrode unit 42 is less than a refractive index of the third electrode unit 43. Therefore, a microcavity effect can be formed by adjusting the refractive indexes of the first electrodes 4 in the different sub-pixel regions, and finally an effect of enhancing color saturation of emitted light and efficiency is achieved.

As shown in FIG. 1, the light emitting layer 5 is formed on the first electrodes 4, the second electrode 6 is formed on the light emitting layer 5, and the display panel 100 is formed finally. The display panel 100 formed by the above method utilizes the microcavity effect to enhance the color saturation of the emitted light and the component efficiency by adjusting the refractive indexes of the first electrodes 4 in each sub-pixel region with different colors.

Another embodiment of the present invention further provides a display device comprising the display panel 100 according to the present invention.

The display panel and the display device provided by the present invention have been described in detail above. It should be understood that exemplary embodiments described herein should be considered only descriptive and are used to help understand the method of the present invention and its core ideas, but not to limit the present invention. Descriptions of features or aspects in each exemplary embodiment should typically be considered as applicable to similar features or aspects in other exemplary embodiments. Although the present invention has been described with reference to the exemplary embodiments, various changes and modifications may be suggested to those skilled in the art. The present invention is intended to cover these changes and modifications within the scope of the appended claims. Any modification, equivalent replacement, and improvement made within the spirit and principle of the present invention shall be included in the protection scope of the present invention.

What is claimed is:

1. A display panel, comprising:
   a substrate;
   a reflective layer disposed on the substrate;
   pixel retaining walls disposed on the reflective layer at intervals;
   first electrodes disposed on the reflective layer between adjacent pixel retaining walls;
   a light emitting layer disposed on the first electrodes; and
   a second electrode disposed on the light emitting layer;
   wherein the first electrodes comprise a first electrode unit, a second electrode unit, and a third electrode unit, wherein a refractive index of the first electrode unit is less than a refractive index of the second electrode unit, and wherein the refractive index of the second electrode unit is less than a refractive index of the third electrode unit.

2. The display panel as claimed in claim 1, wherein the first electrode unit, the second electrode unit, and the third electrode unit are respectively disposed corresponding to a blue pixel, a green pixel, and a red pixel, the refractive index of the first electrode unit is less than the refractive index of the second electrode unit, and the refractive index of the second electrode unit is less than the refractive index of the third electrode unit.

3. The display panel as claimed in claim 1, wherein a composition material of the reflective layer comprises one or more of Ag, Al, Au, and Pt.

4. The display panel as claimed in claim 1, wherein a thickness of the reflective layer ranges from 100 nm to 500 nm.

5. The display panel as claimed in claim 1, wherein a thickness of the pixel retaining walls ranges from 300 nm to 1000 nm.

6. The display panel as claimed in claim 1, wherein a liquid repellent layer is provided on a surface of the pixel retaining walls away from the substrate.

7. The display panel as claimed in claim 1, wherein a composition material of the first electrodes comprises one or more of indium tin oxide (ITO), indium zinc oxide (IZO), antimony-doped tin oxide (ATO), and a composite ink of poly (3,4-ethylenedioxythiophene) and poly-p-styrene sulfonic acid.

8. The display panel as claimed in claim 1, wherein a thickness of the first electrodes ranges from 10 nm to 50 nm.

9. A display device, comprising:
a display panel, wherein the display panel comprises:
a substrate;
a reflective layer disposed on the substrate;
pixel retaining walls disposed on the reflective layer at intervals;
first electrodes disposed on the reflective layer between adjacent pixel retaining walls;
a light emitting layer disposed on the first electrodes; and
a second electrode disposed on the light emitting layer;
wherein the first electrodes comprise a first electrode unit, a second electrode unit, and a third electrode unit, wherein a refractive index of the first electrode unit is less than a refractive index of the second electrode unit, and wherein the refractive index of the second electrode unit is less than a refractive index of the third electrode unit.

10. The display device as claimed in claim 9, wherein the first electrode unit, the second electrode unit, and the third electrode unit are respectively disposed corresponding to a blue pixel, a green pixel, and a red pixel, the refractive index of the first electrode unit is less than the refractive index of the second electrode unit, and the refractive index of the second electrode unit is less than the refractive index of the third electrode unit.

11. The display device as claimed in claim 9, wherein a composition material of the reflective layer comprises one or more of Ag, Al, Au, and Pt.

12. The display device as claimed in claim 9, wherein a thickness of the reflective layer ranges from 100 nm to 500 nm.

13. The display device as claimed in claim 9, wherein a thickness of the pixel retaining walls ranges from 300 nm to 1000 nm.

14. The display device as claimed in claim 9, wherein a liquid repellent layer is provided on a surface of the pixel retaining walls away from the substrate.

15. The display device as claimed in claim 9, wherein a composition material of the first electrodes comprises one or more of indium tin oxide (ITO), indium zinc oxide (IZO), antimony-doped tin oxide (ATO), and a composite ink of poly (3,4-ethylenedioxythiophene) and poly-p-styrene sulfonic acid.

16. The display device as claimed in claim 9, wherein a thickness of the first electrodes ranges from 10 nm to 50 nm.

* * * * *